(12) United States Patent
Propp et al.

(10) Patent No.: US 8,155,176 B2
(45) Date of Patent: Apr. 10, 2012

(54) DIGITAL EQUALIZATION PROCESS AND MECHANISM

(75) Inventors: Michael B. Propp, Brookline, MA (US); Khaled Saab, Randolph, MA (US)

(73) Assignee: Adaptive Networks, Inc., Newton, MA (US)

(*) Notice: Subject to any disclaimer, the term of this patent is extended or adjusted under 35 U.S.C. 154(b) by 2070 days.

(21) Appl. No.: 10/486,243

(22) PCT Filed: Aug. 9, 2002

(86) PCT No.: PCT/US02/25138
§ 371 (c)(1), (2), (4) Date: Aug. 4, 2004

(87) PCT Pub. No.: WO03/015292
PCT Pub. Date: Feb. 20, 2003

(65) Prior Publication Data
US 2005/0069064 A1    Mar. 31, 2005

Related U.S. Application Data

(60) Provisional application No. 60/311,081, filed on Aug. 10, 2001.

(51) Int. Cl.
*H03H 7/30* (2006.01)
*H04L 7/00* (2006.01)
*H04B 15/00* (2006.01)

(52) U.S. Cl. .................. 375/229; 375/355; 375/285

(58) Field of Classification Search .......... 375/355, 375/285, 229–235, 240.02–240.07, 240.12, 375/240.26–240.29, 278, 284, 324, 346–350
See application file for complete search history.

(56) References Cited

U.S. PATENT DOCUMENTS

| | | | |
|---|---|---|---|
| 5,121,415 A | | 6/1992 | Goodman et al. |
| 5,701,333 A | | 12/1997 | Okanoue et al. |
| 5,727,072 A | | 3/1998 | Raman |
| 5,834,979 A | | 11/1998 | Yatsuka |
| 5,838,740 A | * | 11/1998 | Kallman et al. ............ 375/346 |
| 5,852,630 A | | 12/1998 | Langberg et al. |
| 5,883,517 A | * | 3/1999 | Broyde et al. .............. 324/522 |
| 6,101,214 A | | 8/2000 | Hershey et al. |
| 6,122,015 A | * | 9/2000 | Al-Dhahir et al. .......... 348/614 |

(Continued)

FOREIGN PATENT DOCUMENTS
WO   97/34421   9/1997
(Continued)

OTHER PUBLICATIONS

Florencio, D., et al., "Multichannel filtering for optimum noise reduction in microphone arrays," 2001 IEEE International Conference on Acoustics, Speech, and Signal Processing, May 11, 2001, pp. 197-200 (4 pages).

(Continued)

*Primary Examiner* — Dac Ha
*Assistant Examiner* — Linda Wong
(74) *Attorney, Agent, or Firm* — Fish & Richardson P.C.

(57) ABSTRACT

A filter is created by sampling noise during an inter-frame gap (110) of a received signal, sampling a data frame preamble (115) from within a data frame (105) of the received signal, and computing filter coefficients based on the noise sampled during the inter-frame gap (110) and the data frame preamble (115) sampled from within the data frame (105).

98 Claims, 8 Drawing Sheets

U.S. PATENT DOCUMENTS

| | | | |
|---|---|---|---|
| 6,151,358 A | 11/2000 | Lee et al. | |
| 6,826,240 B1* | 11/2004 | Thomas et al. | 375/340 |
| 6,912,258 B2* | 6/2005 | Birru | 375/340 |
| 7,218,666 B2* | 5/2007 | Baum et al. | 375/148 |
| 7,239,650 B2* | 7/2007 | Rakib et al. | 370/480 |
| 7,577,262 B2* | 8/2009 | Kanamori et al. | 381/94.7 |
| 2001/0028692 A1* | 10/2001 | Wiese et al. | 375/346 |
| 2002/0110138 A1* | 8/2002 | Schramm | 370/430 |
| 2005/0259727 A1* | 11/2005 | Benvenuto et al. | 375/233 |
| 2007/0104265 A1* | 5/2007 | Lin et al. | 375/233 |
| 2008/0080607 A1* | 4/2008 | Shah | 375/232 |
| 2008/0107282 A1* | 5/2008 | Asada | 381/71.14 |
| 2008/0112570 A1* | 5/2008 | Asada et al. | 381/71.6 |
| 2008/0153448 A1* | 6/2008 | Murakami | 455/296 |
| 2008/0181292 A1* | 7/2008 | Yang et al. | 375/232 |
| 2009/0052775 A1* | 2/2009 | Moon et al. | 382/167 |
| 2010/0027727 A1* | 2/2010 | Kelley | 375/346 |
| 2010/0322299 A1* | 12/2010 | Draving | 375/232 |
| 2010/0322364 A1* | 12/2010 | Bogdan | 375/350 |
| 2011/0007907 A1* | 1/2011 | Park et al. | 381/71.8 |

FOREIGN PATENT DOCUMENTS

| | | |
|---|---|---|
| WO | 97/38507 | 10/1997 |
| WO | 00/79712 | 12/2000 |
| WO | 01/48991 | 7/2001 |

OTHER PUBLICATIONS

Supplementary European Search Report for Application No. 02750450.5-1237, dated Mar. 26, 2008, 4 pages.

European Office Action of Application No. 02 750 450.5-1237, dated May 30, 2008 (6 pages).

* cited by examiner

DIGITAL EQUALIZATION PROCESS AND MECHANISM

CROSS REFERENCE TO RELATED APPLICATIONS

This application claims priority from U.S. Provisional Application No. 60/311,081, filed Aug. 10, 2001, and titled "Digital Equalization Process and Mechanism," which is incorporated by reference.

TECHNICAL FIELD

This disclosure relates to data communications over noisy media with frequency-dependent attenuation.

BACKGROUND

In data communications, wideband transmission may be used. However, the received signal may be impaired by noise and frequency-dependent channel attenuation. For example, an entire portion of the transmitted signal may fall into an attenuation null and be severely attenuated. In addition, the intersymbol interference (ISI) could degrade the signal causing a high bit error rate which may render an error correction engine useless.

SUMMARY

In one general aspect, a filter is created by sampling noise during an inter-frame gap of a received signal, sampling a data frame preamble from within a data frame of the received signal, and computing filter coefficients based on the noise sampled during the inter-frame gap and the data frame preamble sampled from within the data frame.

Implementations may include one or more of the following features. For example, the filter may be structured and arranged to filter received signals communicated across power lines.

The received signal may be synchronized to identify the data frame preamble. The received signal may be synchronized by sampling a randomly located portion of the received signal, generating a pre-filter based on the randomly located portion of the sampled received signal, applying the pre-filter to the received signal, and identifying the data frame preamble based on the received signal after applying the pre-filter.

The filter coefficients may be computed by generating noise filter coefficients from the noise sampled during the inter-frame gap, generating channel filter coefficients from the data frame preamble sampled from within the data frame, and generating the filter coefficients based on the noise filter coefficients and the channel filter coefficients. The noise filter coefficients may be generated from the noise sampled during the inter-frame gap and the data frame preamble sampled from within the data frame.

The channel filter coefficients may be generated by identifying channel filter coefficients based on a threshold criteria and updating the channel filter coefficients that are identified based on the threshold criteria. The channel filter coefficients may be updated by performing an excision algorithm. The channel filter coefficients may be updated by modifying the channel filter coefficients. The channel filter coefficients may be modified by reducing a magnitude of the channel filter coefficients that are identified based on the threshold criteria.

Additionally or alternatively, the channel filter coefficients may be updated by performing a smoothing algorithm. The channel filter coefficients may be updated by replacing the channel filter coefficients with replacement channel filter coefficients. In one implementation, the replacement channel filter coefficients may include channel filter coefficients not identified based on the threshold criteria.

In another general aspect, adaptively filtering a data frame of a received signal includes generating coefficients for an adaptive filter based on at least noise from within an inter-frame gap and a preamble of the data frame and filtering the data frame by applying the adaptive filter to the data frame.

Implementations may includes one or more of the following features. For example, the data frame may be communicated across power lines such that the data frame may be filtered by applying the adaptive filter to the data frame that is communicated across the power lines.

The coefficients for the adaptive filter may be generated by sampling noise during an inter-frame gap of a received signal, sampling a data frame preamble from within a data frame of the received signal, and computing filter coefficients based on the noise sampled during the inter-frame gap and the data frame preamble sampled from within the data frame.

The received signal may be synchronized to identify the data frame preamble. The received signal may be synchronized by sampling a randomly located portion of the received signal, generating a pre-filter based on the randomly located portion of the sampled received signal, applying the pre-filter to the received signal, and identifying the data frame preamble based on the received signal after applying the pre-filter.

The filter coefficients may be computed by generating noise filter coefficients from the noise sampled during the inter-frame gap, generating channel filter coefficients from the data frame preamble sampled from within the data frame, and generating the filter coefficients based on the noise filter coefficients and the channel filter coefficients. The noise filter coefficients may be generated from the noise sampled during the inter-frame gap and the data frame preamble sampled from within the data frame.

The channel filter coefficients may be generated by identifying channel filter coefficients based on a threshold criteria and updating the channel filter coefficients that are identified based on the threshold criteria. The channel filter coefficients may be updated by performing an excision algorithm. The channel filter coefficients may be updated by modifying the channel filter coefficients. The channel filter coefficients may be modified by reducing a magnitude of the channel filter coefficients that are identified based on the threshold criteria.

Additionally or alternatively, the channel filter coefficients may be updated by performing a smoothing algorithm. The channel filter coefficients may be updated by replacing the channel filter coefficients with replacement channel filter coefficients. In one implementation, the replacement channel filter coefficients may include channel filter coefficients not identified based on the threshold criteria.

In another general aspect, a filter is derived from a combination of coefficients. The coefficients used to derive the filter include coefficients derived from noise sampled during a period between data frames and a received data frame preamble and coefficients derived from the received data frame preamble and a transmitted data frame preamble.

Implementations may include one or more of the following features. For example, the coefficients derived from the noise may include an average of the coefficients derived from the noise over a period of time. The coefficients derived from the received data frame preamble may include an average of the coefficients derived from the data frame preamble over a period of time. The filter derived from the combination of the coefficients may include an average of the filters derived from the combination of the coefficients over a period of time. The coefficients derived from the noise may include an average of the noise over a period of time. The coefficients derived from the received data frame preamble may include an average of the data frame preamble over a period of time.

In another general aspect, receiving a signal transmitted through at least first and second communication paths over a single communication medium includes sampling the signal over the communication paths to realize a first sampling from the first communication path and a second sampling from the second communication path, synchronizing the first sampling and the second sampling, and combining the first sampling and the second sampling to generate a signal representative of the signal transmitted through the first and second communication paths.

Implementations may include one or more of the following features. For example, the first sampling and the second sampling may be synchronized by independently synchronizing the first sampling and the second sampling and adjusting for a delay difference between the first and the second communication paths based on the independent synchronization of the first sampling and the second sampling. The first communication path may include line-neutral path. The second communication path may include a neutral-ground path.

In another general aspect, pre-filtering a received signal to improve synchronization includes sampling a randomly located portion of the received signal, generating a pre-filter based on the randomly located portion of the sampled received signal, applying the pre-filter to the received signal, and identifying a data frame preamble based on the received signal after applying the pre-filter to improve synchronization.

Implementations may include one or more of the following features. For example, sampling the randomly located portion of the received signal may include sampling within noise and generating the pre-filter may include generating the pre-filter based on the sampled noise. The received signal may include data and noise. A portion of the received signal may be sampled at a randomly selected location.

In one implementation, the pre-filter may include a hybrid prediction filter that produces a desired response as an inverse of a value related to a portion of the received signal.

These general and specific aspects may be implemented using a system, a method, or a computer program, or any combination of systems, methods, or computer programs.

Other features will be apparent from the description and drawings, and from the claims.

DESCRIPTION OF DRAWINGS

Like reference symbols in the various drawings may indicate like elements.

DETAILED DESCRIPTION

Figure 1:
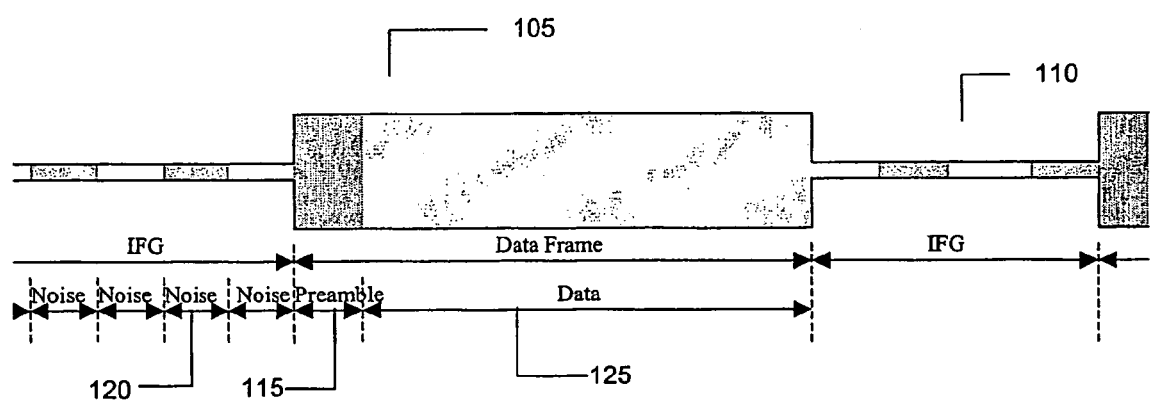
FIG. 1 is a block diagram of a data frame including time intervals before and after the data frame.

FIG. 1 illustrates a portion 100 of an exemplary data frame 105 including time intervals before and after the frame, such as an Inter-Frame Gap (IFG) 110. Data frame 105 may include bits transmitted over a communications system, including a preamble 115 and a data portion 125. The preamble 115 may include a synchronization preamble having a number of bits that are at the beginning of each data frame 105. Additionally or alternatively, preamble 115 may be located at the beginning of a data block, which may include several data portions 125 arranged in series (now shown). The preamble 115 may be used by a receiver to lock and to synchronize with the bit timing of a transmitter. A received signal may include any data, data gaps, and noise received, such as, for example, data frame 105, IFG 110, noise 120, preamble 115, and data 125.

IFG 110 may include a gap between data frames 105 in which data 125 typically is not transmitted. IFG 110 may include noise 120, e.g., resulting from a time interval with no transmitted data.

In general, a network system that transmits and receives data communications may detect the data frame 105 to perform processes such as, for example, digital equalization and filtering. For example, it may be desirable to construct noise filters and to instantaneously adapt the equalization and noise filters on a frame-by-fame basis. By instantaneously adapting the equalization and the noise filters on a frame-by-frame basis, the need for memory of the filter outside of the current data frame 105 and dependency on the previous data frame 105 may be reduced or eliminated altogether.

In one implementation, frequency-domain equalization may be used to retrieve the transmitted data over a noisy transmission channel with frequency-dependent attenuation (e.g., impairments of white noise, periodic noise, multipath propagation, and different impedances). A filter may be designed to reduce or eliminate the noise, correct for the channel distortion and the channel attenuation, and/or compensate for the ISI.

In this implementation, the desired equalization and filtering may be accomplished by using the IFG 110 to sample the noise, and then use the captured noise and the preamble 115 to construct a filter (e.g., an optimal Wiener filter).

Figure 2:
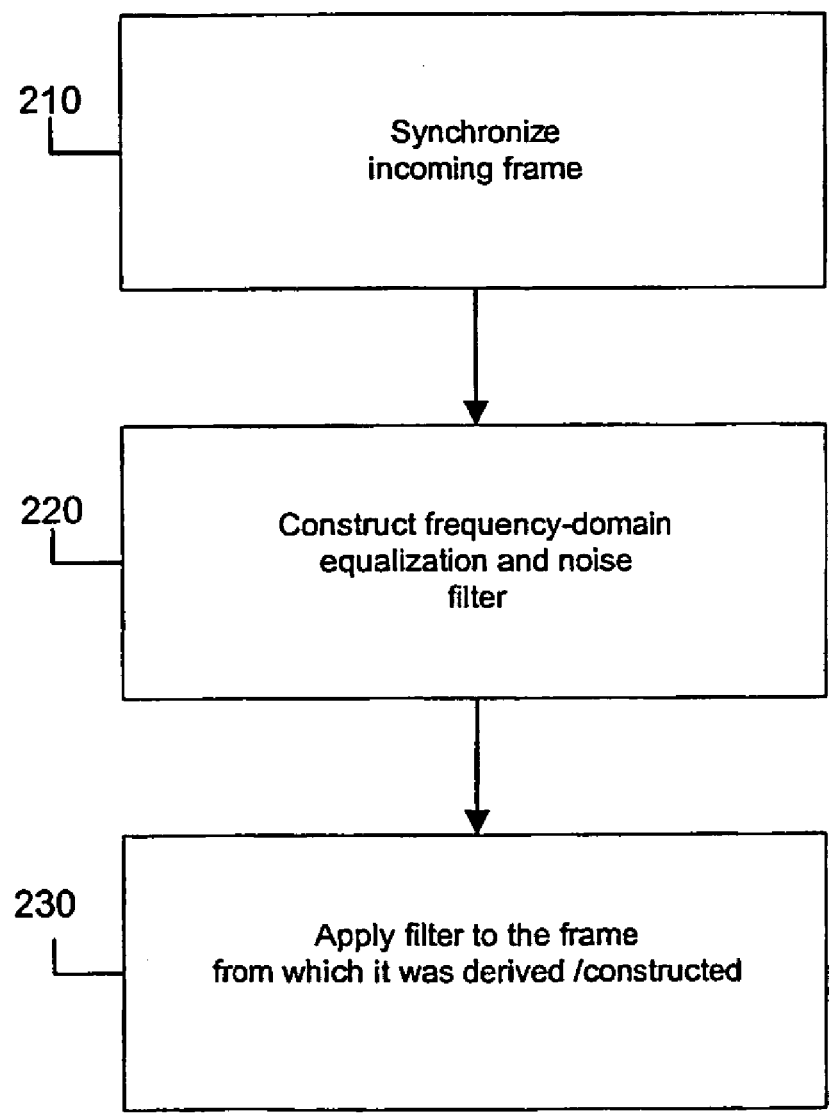
FIG. 2 is a flow chart of an exemplary process for digital equalization.

FIG. 2 illustrates a process 200 for digital equalization. Process 200 typically includes synchronizing an incoming data frame (step 210), constructing a frequency-domain equalization and noise filter (step 220), and applying the filter to the frame from which it was derived/constructed (step 230).

In general, synchronizing the incoming frame (step 210) includes receiving a signal and locating a frame, namely, identifying the beginning and/or the end of the frame. Various modulation schemes may be used in transmitting and receiving bit streams. In one example implementation, a binary phase shift keying (BPSK) modulation scheme may be used, however, other modulation schemes are also available for application to the digital equalization process.

For synchronization (step 210), the incoming signal may be over-sampled (e.g., by a factor of N) and an algorithm (e.g., a maximal likelihood algorithm) may be used to estimate the incoming bit value. The received bit sequence (e.g., a 64-bit preamble) then may be correlated to the predefined and stored transmitted bit sequence and submitted to decision logic that may determine if the sequence corresponds to the predefined transmitted preamble. The synchronization process 210 may be performed at the receiving location of the incoming bit stream. For example, the synchronization 210 may occur at a receiver circuit located at the receiving location. Synchronization process 210 may be used to maintain proper bit timing at the receiver location. Synchronization process 210 may involve locating a sync position (e.g., locating the preamble). By identifying the beginning and/or the end of the frame in the synchronization (step 210), the IFG may be located and noise within the IFG may be sampled in step 220.

Constructing the frequency-domain equalization and noise filter (step 220) may include using one or more samples of the noise in the IFG, the received preamble, and the transmitted preamble. Once the incoming frame has been synchronized (step 210), the noise may be sampled and one or more filters may be computed and constructed. For instance, two complementary filters may be computed (e.g., a noise filter and a channel filter). A combination of the noise filter and the channel filter may be used to generate a filter, such as a Wiener filter or some other filter capable of being used as an optimal filter. Additionally and/or alternatively, the construction of the filter (step 220) may include using an average of samples of the noise in the IFG, the received preamble, the transmitted preamble, and/or constructed filters over a period of time.

Applying the filter to the frame from which it was derived (step 230) may include multiplying the filter coefficients by the incoming data frame. Examples of the processes described by steps 210 and 220 are described below in more detail with respect to FIGS. 3 and 4-5, respectively.

Figure 3:
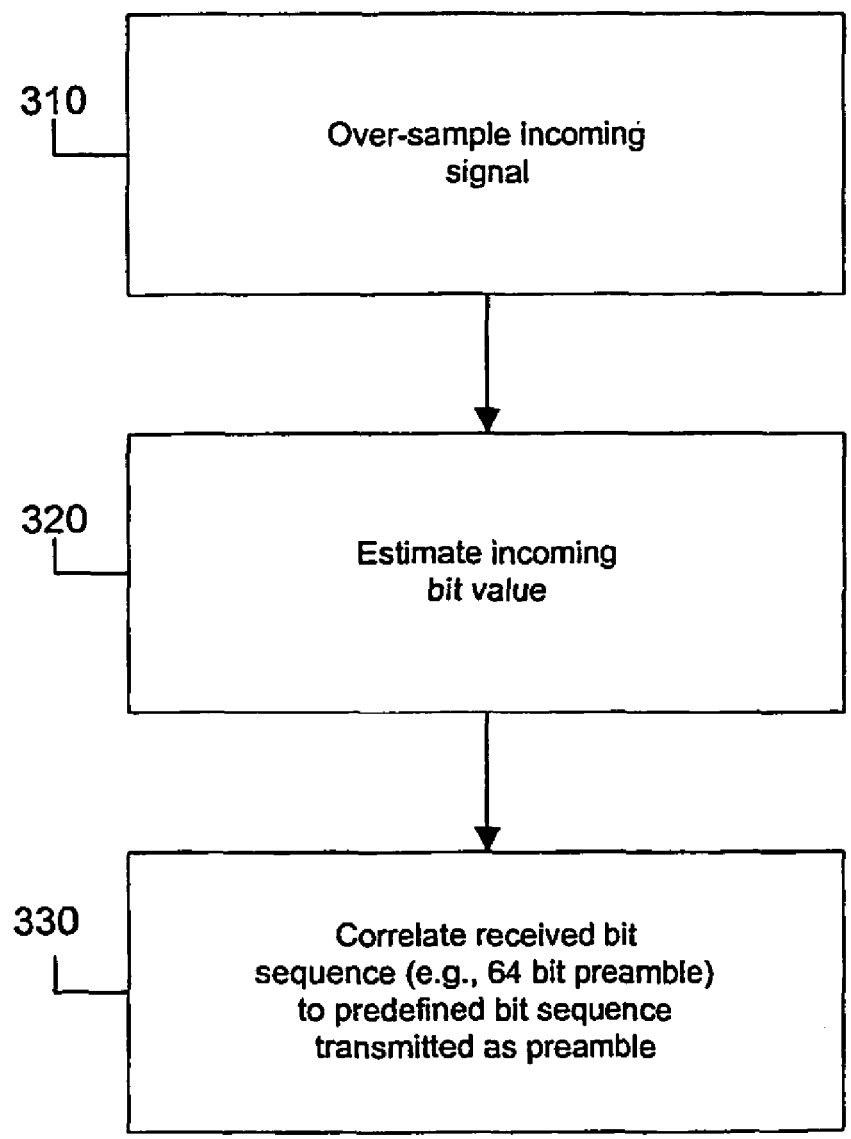
FIG. 3 is a flow chart of an exemplary process for synchronizing an incoming bit stream.

FIG. 3 is an expansion of the synchronization process 210 from FIG. 2. FIG. 3 typically includes sampling the incoming signal (step 310), estimating the incoming bit value (step 320), and correlating the received bit sequence (e.g., the 64-bit preamble) to a predefined bit sequence that was transmitted as the preamble (step 330).

Over-sampling the incoming signal (step 310) may include over-sampling the incoming signal by a factor of N. Over-sampling of the signal (step 310) may be performed by an analog-to-digital converter (ADC), or by another circuit capable of over-sampling an incoming signal. Estimating the incoming bit value (step 320) may include demodulating the over-sampled incoming data into a single binary bit stream. Correlating the received bit sequence (step 330) may include correlating the over-sampled incoming data stream against a stored copy of the transmitted bit wave form. For example, in step 330, the incoming data stream may be correlated against a sine wave. For a more detailed description of the synchronization process 210, section 5.1 Synchronizer is provided below, which includes subsections 5.1.1 Demodulator, 5.1.1.1 Correlator, 5.1.1.2 Threshold Function, and 5.1.2 Synchronization.

Figure 4:
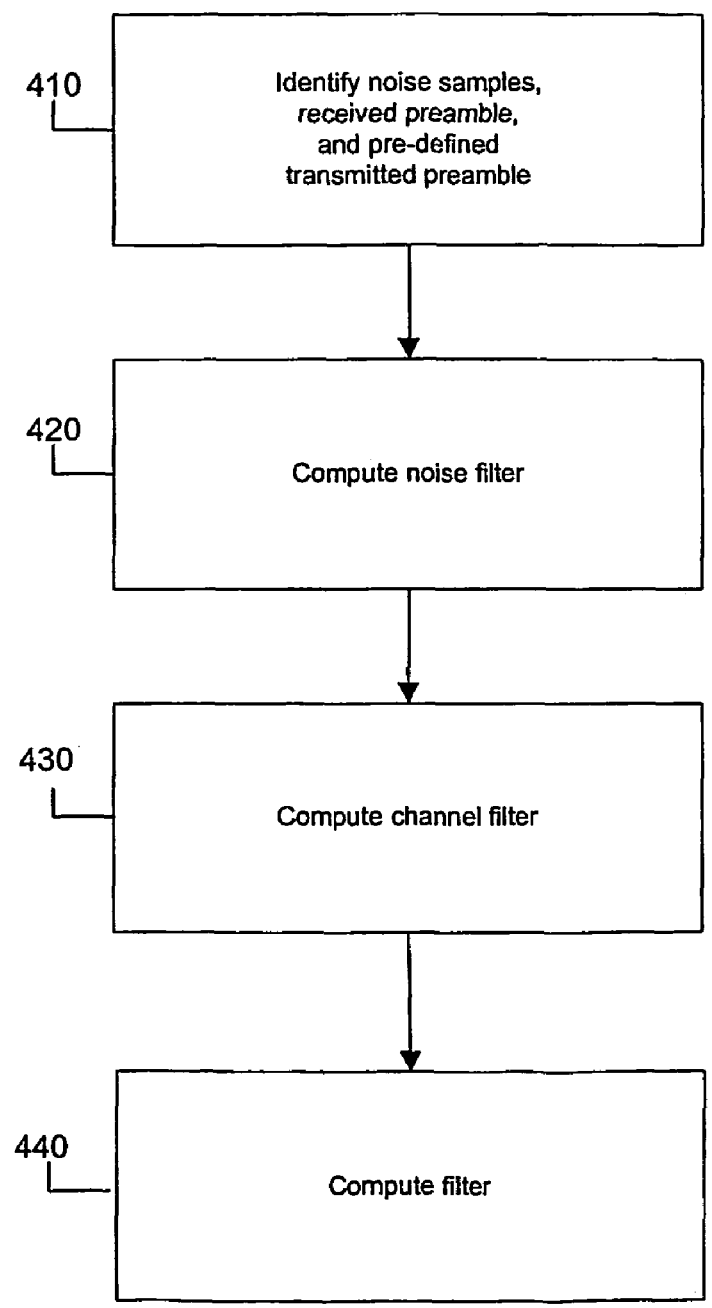
FIG. 4 is a flow chart of an exemplary process for constructing a frequency-domain equalization and noise filter.

FIG. 4 illustrates one implementation of the process 220 of FIG. 2 for constructing a frequency-domain equalization and noise filter. Constructing the filter typically includes identifying noise samples, the received preamble, and predefined transmitted preamble (step 410), computing a noise filter (step 420), a channel filter (step 430), and ultimately a filter that is applied to the data frame (step 440). For a more detailed description of the filter construction process, section 5.2 Filter is provided below with subsections 5.2.1 Noise Filter, 5.2.1.1 Noise Filter Computation, 5.2.2 Channel Filter, 5.2.2.1 Raw Channel Filter Computation, 5.2.2.2 Excision, and 5.2.2.3 Smoothing.

Figure 5:
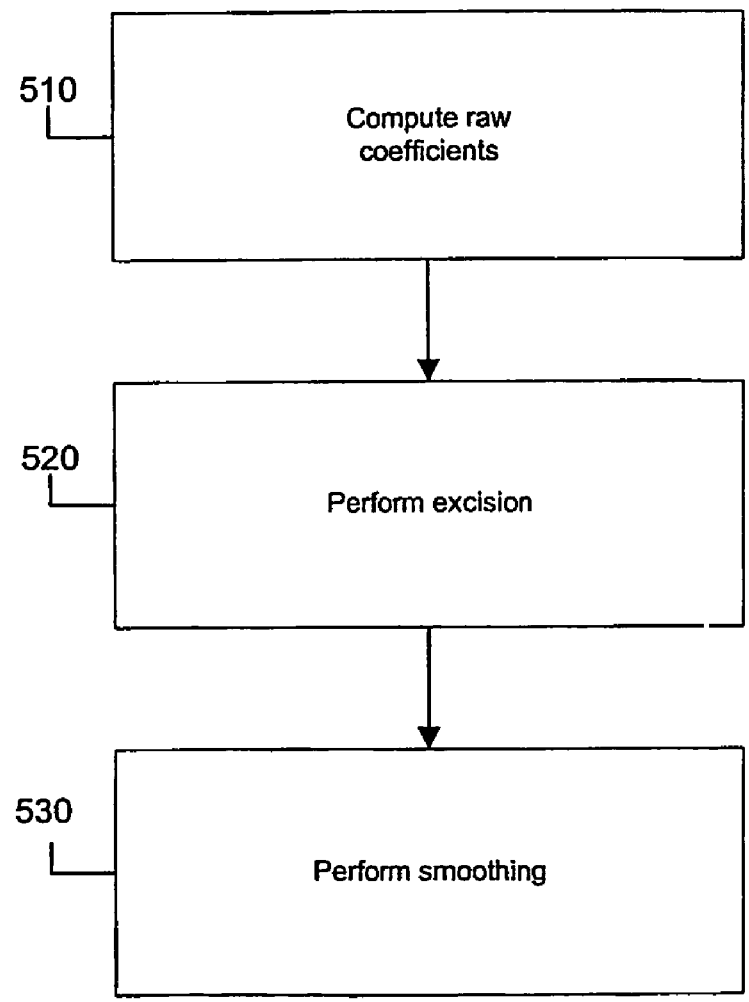
FIG. 5 is a flow chart of an exemplary process for computing a channel filter.

A channel filter may be computed (step 430) as described more fully with respect to FIG. 5. Computing a channel filter typically includes computing the raw coefficients (step 510), performing excision (step 520) and performing smoothing (step 530). For a more detailed description of the channel filter construction process, sections 5.2.2.1 Raw Channel Filter Computation, 5.2.2.2 Excision, and 5.2.2.3 Smoothing are provided below.

Figure 6:
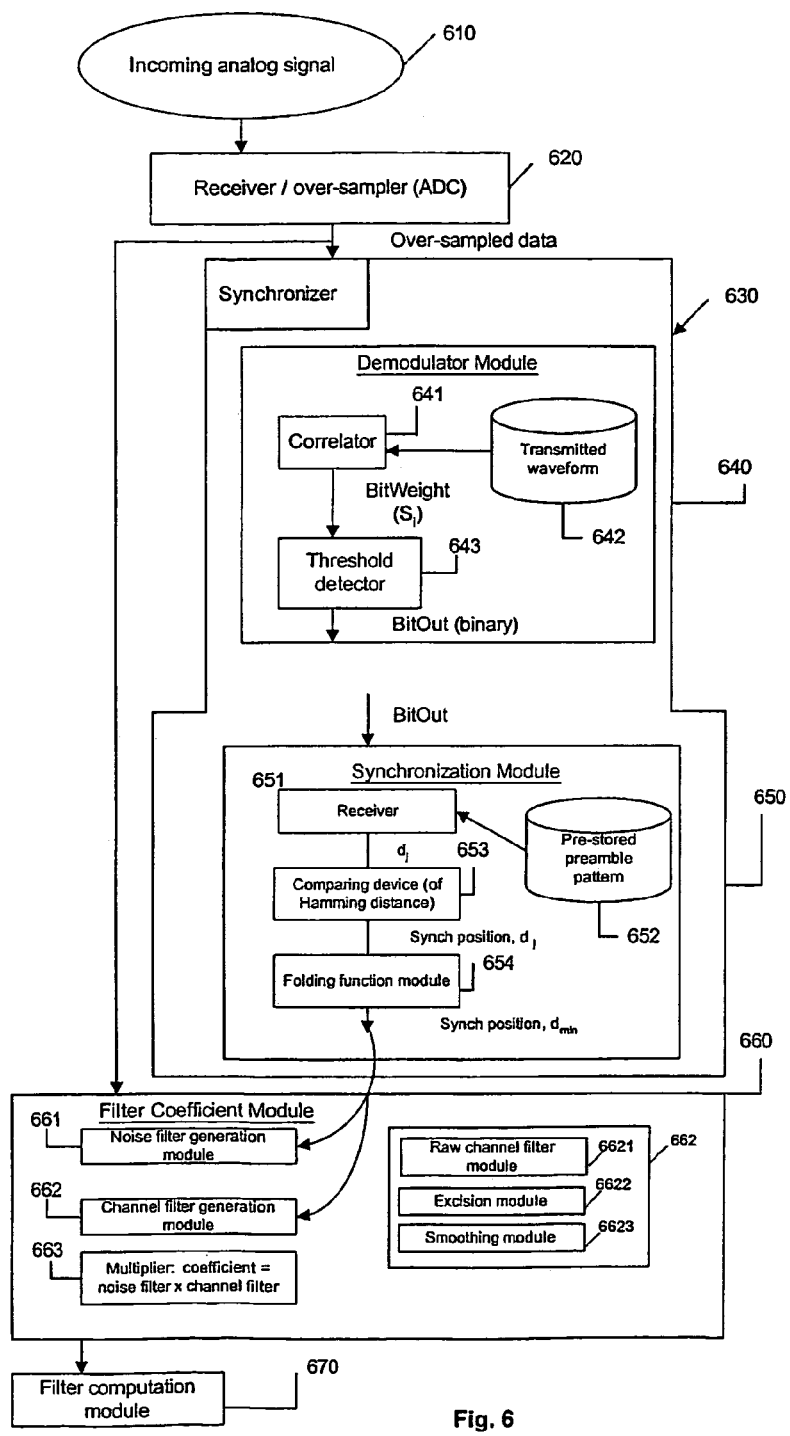
FIG. 6 is a block diagram of a system capable of performing digital equalization.

FIG. 6 illustrates a system for digital equalization. The digital equalization system typically receives an incoming signal 610 (e.g., an analog signal) and applies a receiver/over-sampler module (e.g., an analog-to-digital converter) 620, a synchronizer 630, a demodulator module 640, a synchronization module 650, and a filter coefficient module 660.

5.1 Synchronizer 630

The synchronizer 630 generally is capable of detecting the preamble of the incoming data The synchronizer 630 typically includes two components: a demodulation/correlation module (maximum likelihood at the bit level) and a synchronization module 650 (maximum likelihood for the preamble).

5.1.1 Demodulator Module 640

The demodulator module 640 generally is capable of converting over-sampled incoming data into a single binary bit-stream of "ones" and "zeroes" (i.e., BitOut). The demodulator module 640 typically includes a correlator 641 and a threshold detector 643.

5.1.1.1 Correlator 641

The sampled data stream from the analog-to-digital converter (ADC) 620 goes into the correlator 641. For each new sample $S_j$, N samples are correlated against a stored copy of the transmitted bit waveform 642 (e.g., in one implementation, a sine wave is used). Thus, for comparison, the transmitted bit waveform 642 is effectively moved across the input data stream like a sliding window, for example, effecting the logic of Equations 1 and 2:

$$BitWeight = \sum_{i=0}^{N-1} receivedBit[i] \times transmittedBit[i] \quad \text{(Equation 1)}$$

with $$transmittedBit[n] = \begin{cases} \sin(2\pi n/N) & \text{for transmitting 1} \\ -\sin(2\pi n/N) & \text{for transmitting 0} \end{cases} \quad \text{(Equation 2)}$$
$$n = 0 \ldots N-1$$

and where N is the over-sampling rate.

The BitWeight generated by the correlator 641 generally has a new value for every sample $S_j$; it is forwarded to a decision logic (the threshold detector 643) that determines if the transmitted bit is "0" or "1" based on the correlation of the sampled region to the pre-stored transmitted bit preamble as reflected by the BitWeight.

5.1.1.2 Threshold Function

The resultant BitWeight is passed to the threshold detector 643 to be processed. The values are compared to defined max and min thresholds (both defaulted to "0").

The threshold detector 643 will convert each BitWeight value into one logical data bit value. This process is shown in the following equation:

```
If (BitWeight > max_threshold)
    BitOut = 1;                  //the received bit is a "1"
If (BitWeight < min_threshold)
    BitOut = 0;                  //the received bit is a "0"
Else
    BitOut = random generated 0 or 1  //no decision can be made
```
(Equation 3)

5.1.2 Synchronization Module 650

The synchronization module 650 detects the beginning and/or the end of the frame. For each new sample $S_j$, the receiver 651 receives the BitOut sequence and the comparing device 653 computes the Hamming distance, $d_j$, between the received symbol sequence (received preamble) and the transmitted symbol sequence (transmitted preamble). The smallest value of $d_j$ for all samples $S_j$ is called the minimum distance $d_{minfolding}$, which may be used to indicate the frame position (e.g., a maximum likelihood detection). The position j for which the Hamming distance is lowest generally is considered the sync position.

The value of the Hamming distance may be passed to the folding function module 654 which may convert the Hamming distance from a [0 ... 64] range number (e.g., a number corresponding to the number of bits in the preamble) into "Folded Hamming distance" which includes a [0 ... 32] range number according to the following equation:

```
if Hamming distance > 32 then
    Folded Hamming distance = 64 - Hamming distance
else
    Folded Hamming distance = Hamming distance.
```

The folding function module 654 enables the detection of both positive and negative phases of the transmitted signal. For example, a phase inversion may occur if the transmitter or receiver is incorrectly plugged into a power outlet. In this instance, the transmitted bits may be inverted in sign causing a "match" condition to correspond to maximum Hamming distance values instead of the minimum Hamming distance values. By folding the Hamming distance, both positive and negative phases of the transmitted signal may be detected by examining the minimum Hamming distance values. The position for which the Folded Hamming distance is minimal $d_{minfolding}$ may be considered as the sync position.

5.2 Filter Coefficient Module 660

The Filter Coefficient Module 660 generates frequency-domain coefficients that will be used to filter the received data stream that are useful in recovering the information content of the transmitted data. In one implementation, for example, the filter coefficient module 660 also may be implemented using an Adaptive Filter Coefficient Engine (AFCE).

In one implementation, the coefficient generation includes determination of channel, noise filters, and ultimately the complex multiplication (i.e., frequency-domain operation) of the channel and noise filters, as described below with respect to Equation 4.

$$\text{FilterCoeffs}(f) = \text{ChannelFilter}(f) \times \text{NoiseFilter}(f) \quad \text{(Equation 4)}$$

5.2.1 Noise Filter 661

The noise filter generation module 661 may include a filter capable of minimizing the effect of the noise generated by the transmission channel. The noise filter generation module 661 generally is based, at least in part, on a sampling of noise from within the quiet period where no data is transmitted, which generally precedes the preamble. It also may be based on data within the preamble identified through synchronization. The sampled noise and/or preamble generally are combined to construct the noise filter itself. This approach is valid as long as the frame length is short enough that the noise could be considered as quasistationary for the frame duration. For the purposes of this example implementation, it may be assumed that the noise is uncorrelated to the data and that the noise is considered quasistationary for the frame duration.

5.2.1.1 Noise Filter Computation

The noise filter may be computed based on equation 5:

$$\text{NoiseFilter}(f) = \frac{|\text{received preamble}(f)|^2 - |\text{noise}(f)|^2}{|\text{received preamble}(f)|^2} \quad \text{(Equation 5)}$$

where $|\text{received preamble}(f)|^2$ represents the power of individual frequency components comprising the discrete spectrum for the received preamble and where $|\text{noise}(f)|^2$ may be determined using equation 6:

$$|\text{noise}(f)|^2 = \min(|\text{noiseRx}\_1(f)|^2, |\text{noiseRx}\_2(f)|^2, \ldots, |\text{noisei Rx}\_k(f)|^2) \quad \text{(Equation 6)}$$

where $|\text{noiseRx}\_(f)|^2$, $|\text{noiseRx}\_2(f)|^2$, ..., $|\text{noiseRx}\_k(f)|^2$ are obtained based on noise snapshots from within the IFG, and k is the number of noise blocks that are captured. As equation 6 is based on the minimum of the power of the individual noise frequency components of the noise streams, it represents a conservative approach (i.e., versus using an average) to characterizing the noise for the noise filter computation. If k is too large, the $|\text{noise}(f)|^2$ component may tend toward "0" for all frequencies counteracting the effect of this conservative characterization of noise. As such, k generally is set to a relatively small value, e.g., 3.

5.2.2 Channel Filter 662

The channel filter 662 may be a filter capable of characterizing the channel and compensating for the channel attenuation and distortion. The channel may be characterized by comparing the received preamble spectrum against the transmitted preamble spectrum. Then, the raw channel filter may be computed by dividing the spectrum of the transmitted preamble bit sequence by the spectrum of the received preamble bit sequence.

Once the raw channel filter has been obtained, additional steps/processing may be performed to eliminate additional interference (e.g., the narrow band interference) and to increase the accuracy of the estimate in the presence of noise.

5.2.2.1 Raw Channel Filter Computation Module 6621

One possible equation for computing the raw channel filter is described as follows. The channel filter 662 may be computed based on frequency-domain division (i.e. complex number division) of the prestored/predetermined transmitter preamble by the received/detected preamble. This is illustrated in the following equation:

$$\text{RawChannelFilter}(f) = \frac{\text{prestored/predetermined transmitted preamble}(f)}{\text{received/detected preamble}(f)} \quad \text{(Equation 7)}$$

For instance, the raw channel filter may be modified by post-processing functions identified as "excision" 6622 and "smoothing" 6623. The excision processing 6622 reduces the gross anomalies of the spectrum, while the smoothing processing 6623 increases the accuracy of the estimate in the presence of noise.

In the implementation described below, excision is performed before smoothing. However, either could be performed independently, or the order could be reversed.

5.2.2.2 Excision Module 6622

Excision 6622 may be used to significantly improve the signal-to-noise ratio by eliminating the narrow-band interference at the receiver. Several excision algorithms generally are known to those of ordinary skill, as have been described. See Analysis of DFT-Based Frequency Excision Algorithms for Direct-Sequence Spread-Spectrum Communications. IEEE Transactions on Communications, vol. 46, No. 8, August 1998. Jeffrey A. Young, and James S. Lehnert.

When using the excision algorithm, the frequency bin(s) to be excised is/are generally identified according to their relative ranking under a predetermined ranking scheme, and the magnitude and method of excision or notching is determined.

In one implementation, the frequency bins having a power value that places them within a selectively high percentage (e.g., the top M percent) of the frequency bins are identified for excision, during which the power values for those frequency bins are reduced by a selectable amount or ratio (e.g., half). More specifically, according to one exemplary implementation of the excision module 6622, power values for the raw channel filter coefficients 6621 are calculated and sorted, and the top M percent of the raw channel filter coefficients are selected and divided by two.

An example implementation is illustrated in the following equation:

```
if (RawChannelFilter(f_i) * noiseFilter(f_i)) in top M % then
    ExcisedChannelFilter(f_i) = ExcisedChannelFilter(f_i)/2
Else
    ExcisedChannelFilter(f_i) = ExcisedChannelFilter(f_i)
        i = 0...size of the FFT filter − 1
```

In this implementation, the excised channel filter spectrum is subject to a smoothing function following the excision.

5.2.2.3 Smoothing Module 6623

The smoothing function performed by smoothing module 6623 can be summarized by the following logic:

if the power of the $|ExcisedChannelFilter(f_i)|^2$ component is greater than the power of the $|ExcisedChannelFilter(f_{i+1})|^2$ component, then the final channel filter for bin "i" will be assigned the $ExcisedChannelFilter(f_{i+1})$ bin value.

An algorithm implementing this logic is as follows:

```
if|ExcisedChannelFilter(f_i)|^2 ≤ |ExcisedChannelFilter(f_{i+1})|^2
    channelFilter(f_i) = ExcisedChannelFilter(f_i)
else
    channelFilter(f_i) = ExcisedChannelFilter(f_{i+1})
``` where $f_i$ cover both the negative and the positive spectrum of the signal.

In one implementation, following calculation of the noise filter coefficients and the channel filter coefficients, a multiplier 663 may be used to generate the ultimate coefficients by performing complex multiplication of the channel and noise filter coefficients, as described above with respect to equation 4, such that a filter may be constructed using the filter computation module 670.

5.2.3 Data Filtering

Figure 7:
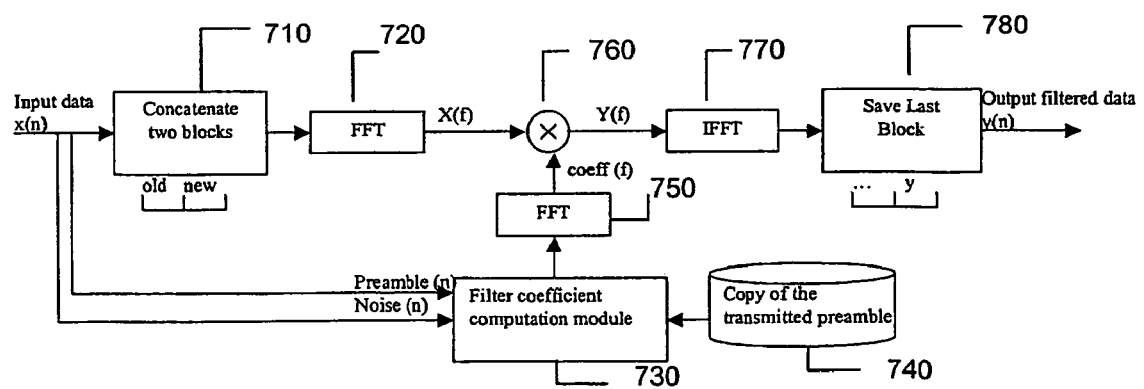
FIG. 7 is a block diagram of a system capable of performing data filtering.

FIG. 7 illustrates an overview of the system 700 used to generate and apply a filter. In one implementation, the overlap-save method may be used to filter the data. The overlap-save method performs a linear convolution between a finite-length sequence (the channel filter coefficients) and an infinite-length sequence (the data) by appropriately partitioning the data. This type of data filtering method generally includes an input module 710, which receives the input data x(n). The input module 710 may concatenate new input data x(n) with old input data. The concatenated data may be sent to a first Fast Fourier Transform (FFT) module 720, where it is used to produce an output X(f).

Component parts of the input data x(n) (e.g., a preamble (n) and noise (n)) may be received at a filter coefficient computation module 730. The filter coefficient computation module 730 also may receive, as input, a copy of the transmitted preamble 740. The filter coefficient computation module 730 computes the appropriate filters and sends its output to a second FFT module 750, which outputs coeff (f). The output X(f) from the first FFT module 720 is multiplied with the output coeff (f) from the second FFT module 750 at multiplier module 760.

The output of multiplier module 760 Y(f) is received at an Inverse FFT module 770, where an inverse FFT process may be performed. The result of the inverse FFT process is saved in a buffer module 780 and the output filtered data y(n) is produced.

Additional improvement(s) and a lower Bit Error Rate may be obtained by pre-filtering the incoming raw data and/or adding additional hardware that further solves the multipath propagation problem.

6.1 Pre-Filtering

Pre-filtering may be performed independently and exclusively, or, in conjunction with of any other filtering processes, such as the filtering processes described above.

As described in section 5.2, the filter coefficient computation may be performed by constructing a channel inverse. This computation generally requires synchronization on the raw signal. Indeed, if the signal is jammed or severely corrupted by noise (e.g., white noise, periodic noise, etc.), the synchronizer could fail and the frame synchronization may not be detectable.

In one implementation, the raw data may be pre-filtered to improve the synchronization capability and thus improve the filter/equalizer performance (section 5.2). Indeed, since the filter/equalizer process uses the raw received preamble to compute the channel inverse, the computed filter coefficients will generally improve with improvements to estimates of the preamble position (the sync position).

More specifically, to pre-filter, the dead time between the blocks may be used to sample the noise and to construct an adaptive noise-canceling filter that is helpful in making preamble bits more identifiable.

Several noise filters could be used for this purpose. For instance, in one implementation, a noise filter used for pre-filtering includes a hybrid version of a "Prediction" filter, where the desired response for the adaptive filter is the inverse of the present input signal value.

Figure 8:
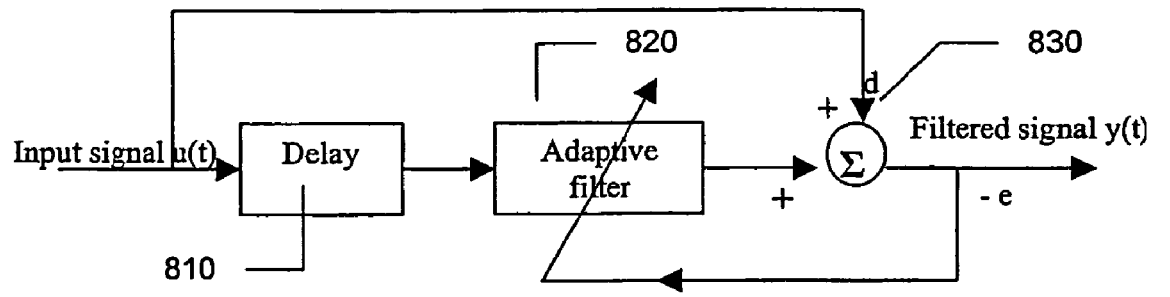
FIG. 8 is a block diagram of a system capable of performing pre-filtering to enhance synchronization.

FIG. 8 illustrates an example implementation of a pre-filtering system. The pre-filtering system of FIG. 8 receives an input signal u(t) that is received at delay module 810, and includes an adaptive filter module 820 and a summation module 830.

In this implementation, the following notations are used for convenience:

s=transmitted signal (uncorrupted by noise),
n=channel noise (white noise, periodic noise . . . ),
ñ=estimate of the channel noise,
u=input applied to the adaptive filter,
y=output of the adaptive filter,
d=desired response of the filter,
e=−(y+d)=estimation error.

This adaptive filter 820 predicts the inverse of the present value of the random input signal, even though past values of the signal supply the input applied to the adaptive filter. The present value of the signal serves the purpose of the desired response for the adaptive filter 820.

When the filter adaptation algorithm (e.g., least mean square algorithm) is enabled, the adaptation process is designed to cancel the input signal u(t) by adjusting the filter coefficients such that y(t)=u(t)+the filter output="0". Assuming that during this adaptation process, u(t) was selected such that it is equal to the noise in the transmission channel (i.e. u(t)=n(t)=the sampled noise during the dead time between the frame(s)), the adaptation process will basically construct a noise-canceling filter that cancels the transmission channel noise such that y(t)=n(t)−ñ(t)≅0.

Once the adaptation process is complete, the adaptation algorithm may be disabled and the obtained filter coefficients locked. Assuming that the noise is quasistationary for the frame duration (see assumption above), the obtained filter could then be considered as a noise-canceling filter that is continuously predicting the inverse of the noise in the transmission channel y(t)=n(t)−ñ(t)≅0. Thus, when data is transmitted u(t)=s(t)+n(t) the filter will cancel the noise n(t) and let pass the transmitted data such that y(t)=s(t)+n(t)−ñ(t)≅s(t).

In another implementation of a pre-filter, for example, if during the period of the preamble, u(t) is selected such that it is equal to the transmitted preamble, then the adaptation process may construct an equalization filter.

6.2 Multipath Propagation

In one implementation, a modem may be designed to transmit on two paths (e.g., a first may be a Line-Neutral path and a second may be a Neutral-Ground path). In theory, the transmitted data (e.g., equalized signals) could be recovered by sampling either path. However, the two paths may have different characteristics due to the difference in the path loads (time-varying values), impedance differences, length differences, and/or noise levels. This frequency-selective fading of the transmission medium could cause amplitude and delay distortion which may degrade the system reliability beyond that expected. It therefore may be difficult to determine which path is the best one to use to recover the transmitted data, whether it is the first path, the second path, or a combination of both paths.

Figure 9:
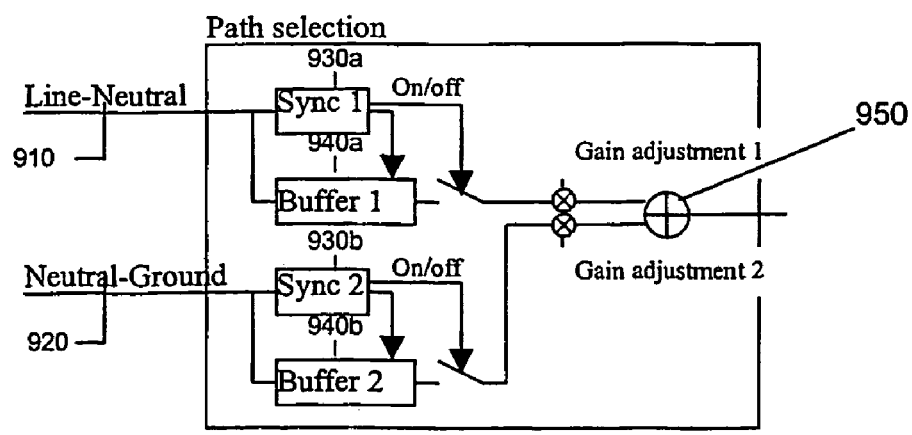
FIG. 9 is a block diagram of a system capable of improving reception of data frames under multipath propagation.

FIG. 9 illustrates one example implementation of a multipath propagation system capable of automatically determining which path or combination of paths is preferred, or optimal. The system may include structures that automatically probe/sample the paths (e.g., Line-Neutral 910 and Neutral-Ground 920), store the data (e.g., by using one or more buffers 930a, 930b), and synchronize (e.g., using synchronizers 940a, 940b) on each path, independently. Further, once a synchronizer 940a, 940b has been detected, the system automatically adjusts for the delay difference between the paths by adjusting the read pointer in the buffers 930a, 930b and then combines the data into a single data stream following gain adjustment module 950.

Indeed, assuming that the buffers are large enough, if we are able to synchronize on both paths 910, 920 (discussed above in section 5.1), the difference in the sync position typically is equal to the difference in the path delays. Thus, the solution presents itself in two parts: first, the synchronizers may be used to compensate for the path delay differences, and second, the filter/equalizer discussed above in section 5.2 may be used to compensate for the distortion. It will be understood that various modifications may be made without departing from the spirit and scope of the claims. For example, the order of the operations (path selection and filtering/equalization) could be changed. Indeed, the data filtering/equalization part could be done on each path independently then data could be combined.

If the attenuation/distortion on either path is too severe such that no synchronization is possible, a single path solution may be realized without any path combination. In another implementation, the addition of "combination thresholds" may refine this feature even further by enabling the two paths to be combined if and only if the quality of the received data on the paths is above a predefined level.

The described systems, methods, and techniques may be implemented in digital electronic and/or analog circuitry, computer hardware, firmware, software, or in combinations of these elements. Apparatus embodying these techniques may include appropriate input and output devices, a computer processor, and a computer program product tangibly embodied in a machine-readable storage device for execution by a programmable processor. A process embodying these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially-designed ASICs (application-specific integrated circuits).

Advantageous results still could be achieved if steps of the disclosed techniques were performed in a different order and/or if components in the disclosed systems were combined in a different manner and/or replaced or supplemented by other components. For example, the transmission medium may include a power line, a telephone line, a cable line, a digital subscriber line (DSL), an integrated services digital network (ISDN) line, a radio frequency (RF) medium, and/or other transmission media. Additionally and/or alternatively, different modulation schemes are also available for application to the digital equalization process. For example, a combination of modulation schemes may be applied to different parts of the signal (e.g., one modulation scheme may be applied to the preamble and a different modulation scheme may be applied to the remainder of the signal). In another implementation, for example, in a multipath propagation implementation, different modulation schemes and/or combinations of different modulation schemes may be applied to each signal on the different communication paths. Accordingly, other implementations are within the scope of the following claims.

What is claimed is:

1. A method for creating a filter, the method comprising:
receiving a signal including a data frame, and a gap occurring before the data frame, the data frame including a data frame preamble, and the gap not including predetermined data;
sampling noise received during reception of the gap of the received signal;
sampling the data frame preamble of the data frame of the received signal;
computing, using at least one processor, filter coefficients based on the noise sampled during reception of the gap and the data frame preamble sampled from the data frame;
generating, based on the computed filter coefficients, a filter;
applying, in response to generation of the filter, the filter to the data frame of the received signal; and
forwarding, in response to application of the filter to the data frame of the received signal, the filtered data frame.

2. The method of claim 1 wherein:
receiving the signal comprises receiving signals communicated across power lines; and
applying the filter to the first data frame of the received signal comprises applying the filter to the first data frame of the received signal across the power lines.

3. The method of claim 1 further comprising synchronizing the received signal to identify the data frame preamble.

4. The method of claim 3 wherein synchronizing the received signal comprises:
sampling a randomly located portion of the received signal;
generating a pre-filter based on the randomly located portion of the sampled received signal;
applying the pre-filter to the received signal; and
identifying, in response to application of the pre-filter to the received signal, the data frame preamble.

5. The method of claim 1 wherein computing the filter coefficients includes:
generating noise filter coefficients from the noise sampled during reception of the gap;
generating channel filter coefficients from the data frame preamble sampled from the data frame; and
generating the filter coefficients based on the noise filter coefficients and the channel filter coefficients.

6. The method of claim 5 wherein generating the noise filter coefficients comprises generating noise filter coefficients from the noise sampled during reception of the gap and the data frame preamble sampled from the data frame.

7. The method of claim 5 wherein generating the channel filter coefficients includes:
identifying channel filter coefficients based on a threshold criteria; and
updating the channel filter coefficients that are identified based on the threshold criteria.

8. The method of claim 7 wherein updating the channel filter coefficients includes performing an excision algorithm.

9. The method of claim 7 wherein updating the channel filter coefficients includes modifying the channel filter coefficients.

10. The method of claim 9 wherein modifying the channel filter coefficients includes reducing a magnitude of the channel filter coefficients that are identified based on the threshold criteria.

11. The method of claim 7 wherein updating the channel filter coefficients includes performing a smoothing algorithm.

12. The method of claim 7 wherein updating the channel filter coefficients includes replacing the channel filter coefficients with replacement channel filter coefficients.

13. The method of claim 12 wherein the replacement channel filter coefficients include channel filter coefficients not identified based on the threshold criteria.

14. A system for creating a filter, the system comprising at least one processor, wherein the at least one processor is configured to:
receive a signal including a data frame, and a gap occurring before the data frame, the data frame including a data frame preamble, and the gap not including predetermined data;
sample noise received during reception of the gap of the received signal;
sample the data frame preamble of the data frame of the received signal;
compute filter coefficients based on the noise sampled during reception of the gap and the data frame preamble sampled from the data frame;
generate, based on the computed filter coefficients, a filter;
apply, in response to generation of the filter, the filter to the data frame of the received signal; and
forward, in response to application of the filter to the data frame of the received signal, the filtered data frame.

15. The system of claim 14 wherein the at least one processor is configured to:
receive the signal by receiving signals communicated across power lines; and
apply the filter to the data frame of the received signal by applying the filter to the data frame of the received signal across the power lines.

16. The system of claim 14 wherein the at least one processor is further configured to synchronize the received signal to identify the data frame preamble.

17. The system of claim 16 wherein the at least one processor is configured to synchronize the received signal by:
sampling a randomly located portion of the received signal;
generating a pre-filter based on the randomly located portion of the sampled received signal;
applying the pre-filter to the received signal; and
identifying, in response to application of the pre-filter to the received signal, the data frame preamble.

18. The system of claim 14 wherein the at least one processor is configured to compute the filter coefficients by:
generating noise filter coefficients from the noise sampled during reception of the gap;
generating channel filter coefficients from the data frame preamble sampled from the data frame; and
generating the filter coefficients based on the noise filter coefficients and the channel filter coefficients.

19. The system of claim 18 wherein the at least one processor is configured to generate the noise filter coefficients by generating noise filter coefficients from the noise sampled during reception of the gap and the data frame preamble sampled from the data frame.

20. The system of claim 18 wherein the at least one processor is configured to generate the channel filter coefficients by:
    identifying channel filter coefficients based on a threshold criteria; and
    updating the channel filter coefficients that are identified based on the threshold criteria.

21. The system of claim 20 wherein the at least one processor is configured to update the channel filter coefficients by performing an excision algorithm.

22. The system of claim 20 wherein the at least one processor is configured to update the channel filter coefficients by modifying the channel filter coefficients.

23. The system of claim 22 wherein the at least one processor is configured to modify the channel filter coefficients by reducing a magnitude of the channel filter coefficients that are identified based on the threshold criteria.

24. The system of claim 20 wherein the at least one processor is configured to update the channel filter coefficients by performing a smoothing algorithm.

25. The system of claim 20 wherein the at least one processor is configured to update the channel filter coefficients by replacing the channel filter coefficients with replacement channel filter coefficients.

26. The system of claim 25 wherein the replacement channel filter coefficients include channel filter coefficients not identified based on the threshold criteria.

27. A storage device storing a computer program for creating a filter, the computer program comprising one or more code segments that, when executed, cause at least one processor to:
    receive a signal including a data frame, and a gap occurring before the data frame, the data frame including a data frame preamble, and the gap not including predetermined data;
    sample noise received during reception of the gap of the received signal;
    sample the data frame preamble of the data frame of the received signal;
    compute filter coefficients based on the noise sampled during reception of the gap and the data frame preamble sampled from the data frame;
    generate, based on the computed filter coefficients, a filter;
    apply, in response to generation of the filter, the filter to the data frame of the received signal; and
    forward, in response to application of the filter to the data frame of the received signal, the filtered data frame.

28. The storage device of claim 27 wherein the one or more code segments that, when executed, cause at least one processor to:
    receive the signal comprise one or more code segments that, when executed, cause at least one processor to receive signals communicated across power lines; and
    apply the filter to the data frame of the received signal comprise one or more code segments that, when executed, cause at least one processor to apply the filter to the data frame of the received signal across the power lines.

29. The storage device of claim 27 wherein the computer program further comprises one or more code segments that, when executed, cause at least one processor to synchronize the received signal to identify the data frame preamble.

30. The storage device of claim 29 wherein the one or more code segments that, when executed, cause at least one processor to synchronize the received signal comprise one or more code segments that, when executed, cause at least one processor to:
    sample a randomly located portion of the received signal;
    generate a pre-filter based on the randomly located portion of the sampled received signal;
    apply the pre-filter to the received signal; and
    identify, in response to application of the pre-filter to the received signal, the data frame preamble.

31. The storage device of claim 27 wherein the one or more code segments that, when executed, cause at least one processor to compute the filter coefficients comprise one or more code segments that, when executed, cause at least one processor to:
    generate noise filter coefficients from the noise sampled during reception of the gap;
    generate channel filter coefficients from the data frame preamble sampled from the data frame; and
    generate the filter coefficients based on the noise filter coefficients and the channel filter coefficients.

32. The storage device of claim 31 wherein the one or more code segments that, when executed, cause at least one processor to generate the noise filter coefficients comprise one or more code segments that, when executed, cause at least one processor to generate noise filter coefficients from the noise sampled during reception of the gap and the data frame preamble sampled from the data frame.

33. The storage device of claim 31 wherein the one or more code segments that, when executed, cause at least one processor to generate the channel filter coefficients comprise one or more code segments that, when executed, cause at least one processor to:
    identify channel filter coefficients based on a threshold criteria; and
    update the channel filter coefficients that are identified based on the threshold criteria.

34. The storage device of claim 33 wherein the one or more code segments that, when executed, cause at least one processor to update the channel filter coefficients comprise one or more code segments that, when executed, cause at least one processor to perform an excision algorithm.

35. The storage device of claim 33 wherein the one or more code segments that, when executed, cause at least one processor to update the channel filter coefficients comprise one or more code segments that, when executed, cause at least one processor to modify the channel filter coefficients.

36. The storage device of claim 35 wherein the one or more code segments that, when executed, cause at least one processor to modify the channel filter coefficients comprise one or more code segments that, when executed, cause at least one processor to reduce a magnitude of the channel filter coefficients that are identified based on the threshold criteria.

37. The storage device of claim 33 wherein the one or more code segments that, when executed, cause at least one processor to update the channel filter coefficients comprise one or more code segments that, when executed, cause at least one processor to perform a smoothing algorithm.

38. The storage device of claim 33 wherein the one or more code segments that, when executed, cause at least one processor to update the channel filter coefficients comprise one or more code segments that, when executed, cause at least one processor to replace the channel filter coefficients with replacement channel filter coefficients.

39. The storage device of claim 38 wherein the replacement channel filter coefficients include channel filter coefficients not identified based on the threshold criteria.

40. A method for adaptively filtering a data frame of a received signal, the method comprising:
   receiving a signal including a data frame, and a gap occurring before the data frame, the data frame including a data frame preamble, and the gap not including predetermined data;
   generating, using at least one processor, coefficients for an adaptive filter based on at least noise received during reception of the gap and the data frame preamble of the data frame by performing operations that include:
   sampling noise received during reception of the gap of the received signal, sampling the data frame preamble of the data frame of the received signal, and computing filter coefficients based on the noise sampled during reception of the gap and the data frame preamble sampled from the data frame;
   applying the adaptive filter to the data frame; and
   forwarding, in response to application of the adaptive filter to the data frame, the filtered data frame.

41. The method of claim 40 wherein:
   receiving the signal comprises receiving signals communicated across power lines; and
   applying the filter to the first data frame of the received signal comprises applying the filter to the data frame of the received signal across the power lines.

42. The method of claim 40 further comprising synchronizing the received signal to identify the data frame preamble.

43. The method of claim 42 wherein synchronizing the received signal comprises:
   sampling a randomly located portion of the received signal;
   generating a pre-filter based on the randomly located portion of the sampled received signal;
   applying the pre-filter to the received signal; and
   identifying, in response to application of the pre-filter to the received signal, the data frame preamble.

44. The method of claim 40 wherein computing the filter coefficients includes:
   generating noise filter coefficients from the noise sampled during reception of the gap;
   generating channel filter coefficients from the data frame preamble sampled from the data frame; and
   generating the filter coefficients based on the noise filter coefficients and the channel filter coefficients.

45. The method of claim 44 wherein generating the noise filter coefficients comprises generating noise filter coefficients from the noise sampled during reception of the gap and the data frame preamble sampled from the data frame.

46. The method of claim 44 wherein generating the channel filter coefficients includes:
   identifying channel filter coefficients based on a threshold criteria; and
   updating the channel filter coefficients that are identified based on the threshold criteria.

47. The method of claim 46 wherein updating the channel filter coefficients includes performing an excision algorithm.

48. The method of claim 46 wherein updating the channel filter coefficients includes modifying the channel filter coefficients.

49. The method of claim 48 wherein modifying the channel filter coefficients includes reducing a magnitude of the channel filter coefficients that are identified based on the threshold criteria.

50. The method of claim 46 wherein updating the channel filter coefficients includes performing a smoothing algorithm.

51. The method of claim 46 wherein updating the channel filter coefficients includes replacing the channel filter coefficients with replacement channel filter coefficients.

52. The method of claim 51 wherein the replacement channel filter coefficients include channel filter coefficients not identified based on the threshold criteria.

53. A system for adaptively filtering a data frame of a received signal, the system comprising at least one processor, wherein the at least one processor is configured to:
   receive a signal including a data frame, and a gap occurring before the data frame, the data frame including a data frame preamble, and the gap not including predetermined data;
   generate coefficients for an adaptive filter based on at least noise received during reception of the gap and the data frame preamble of the data frame by performing operations that include:
   sampling noise received during reception of the gap of the received signal,
   sampling the data frame preamble of the data frame of the received signal, and
   computing filter coefficients based on the noise sampled during reception of the gap and the data frame preamble sampled from the data frame;
   apply the adaptive filter to the data frame; and
   forward, in response to application of the adaptive filter to the data frame, the filtered data frame.

54. The system of claim 53 wherein the at least one processor is configured to:
   receive the signal by receiving signals communicated across power lines; and
   apply the filter to the data frame of the received signal by applying the filter to the data frame of the received signal across the power lines.

55. The system of claim 54 wherein the at least one processor is further configured to synchronize the received signal to identify the data frame preamble.

56. The system of claim 55 wherein the at least one processor is configured to synchronize the received signal by:
   sampling a randomly located portion of the received signal;
   generating a pre-filter based on the randomly located portion of the sampled received signal;
   applying the pre-filter to the received signal; and
   identifying, in response to application of the pre-filter to the received signal, the data frame preamble.

57. The system of claim 53 wherein the at least one processor is configured to compute the filter coefficients by:
   generating noise filter coefficients from the noise sampled during reception of the gap;
   generating channel filter coefficients from the data frame preamble sampled from the data frame; and
   generating the filter coefficients based on the noise filter coefficients and the channel filter coefficients.

58. The system of claim 57 wherein the at least one processor is configured to generate the noise filter coefficients by generating noise filter coefficients from the noise sampled during reception of the gap and the data frame preamble sampled from the data frame.

59. The system of claim 57 wherein the at least one processor is configured to generate the channel filter coefficients by:
   identifying channel filter coefficients based on a threshold criteria; and
   updating the channel filter coefficients that are identified based on the threshold criteria.

60. The system of claim 59 wherein the at least one processor is configured to update the channel filter coefficients by performing an excision algorithm.

61. The system of claim 59 wherein the at least one processor is configured to update the channel filter coefficients by modifying the channel filter coefficients.

62. The system of claim 61 wherein the at least one processor is configured to modify the channel filter coefficients by reducing a magnitude of the channel filter coefficients that are identified based on the threshold criteria.

63. The system of claim 59 wherein the at least one processor is configured to update the channel filter coefficients by performing a smoothing algorithm.

64. The system of claim 59 wherein the at least one processor is configured to update the channel filter coefficients by replacing the channel filter coefficients with replacement channel filter coefficients.

65. The system of claim 64 wherein the replacement channel filter coefficients include channel filter coefficients not identified based on the threshold criteria.

66. A storage device storing a computer program for adaptively filtering a data frame of a received signal, the computer program comprising one or more code segments that, when executed, cause at least one processor to:
receive a signal including a data frame, and a gap occurring before the data frame, the data frame including a data frame preamble, and the gap not including predetermined data;
generate coefficients for an adaptive filter based on at least noise received during reception of the gap and the data frame preamble of the data frame by performing operations that include:
sample noise received during reception of the gap of the received signal,
sample the data frame preamble of the data frame of the received signal, and
compute filter coefficients based on the noise sampled during reception of the gap and the data frame preamble sampled from the data frame;
apply the adaptive filter to the data frame; and
forward, in response to application of the adaptive filter to the data frame, the filtered data frame.

67. The storage device of claim 66 wherein the one or more code segments that, when executed, cause at least one processor to:
receive the signal comprise one or more code segments that, when executed, cause at least one processor to receive signals communicated across power lines; and
apply the filter to the data frame of the received signal comprise one or more code segments that, when executed, cause at least one processor to apply the filter to the data frame of the received signal across the power lines.

68. The storage device of claim 66 wherein the computer program further comprises one or more code segments that, when executed, cause at least one processor to synchronize the received signal to identify the data frame preamble.

69. The storage device of claim 68 wherein the one or more code segments that, when executed, cause at least one processor to synchronize the received signal comprise one or more code segments that, when executed, cause at least one processor to:
sample a randomly located portion of the received signal;
generate a pre-filter based on the randomly located portion of the sampled received signal;
apply the pre-filter to the received signal; and
identify, in response to application of the pre-filter to the received signal, the data frame preamble.

70. The storage device of claim 66 wherein computing the filter coefficients includes one or more code segments that when executed on the processor cause the processor to:
generate noise filter coefficients from the noise sampled during reception of the gap;
generate channel filter coefficients from the data frame preamble sampled from the data frame; and
generate the filter coefficients based on the noise filter coefficients and the channel filter coefficients.

71. The storage device of claim 70 wherein the one or more code segments that, when executed, cause at least one processor to generate the noise filter coefficients comprise one or more code segments that, when executed, cause at least one processor to generate noise filter coefficients from the noise sampled during reception of the gap and the data frame preamble sampled from the data frame.

72. The storage device of claim 70 wherein the one or more code segments that, when executed, cause at least one processor to generate the channel filter coefficients comprise one or more code segments that, when executed, cause at least one processor to:
identify channel filter coefficients based on a threshold criteria; and
update the channel filter coefficients that are identified based on the threshold criteria.

73. The storage device of claim 72 wherein the one or more code segments that, when executed, cause at least one processor to update the channel filter coefficients comprise one or more code segments that, when executed, cause at least one processor to perform an excision algorithm.

74. The storage device of claim 72 wherein the one or more code segments that, when executed, cause at least one processor to update the channel filter coefficients comprise one or more code segments that, when executed, cause at least one processor to modify the channel filter coefficients.

75. The storage device of claim 74 wherein the one or more code segments that, when executed, cause at least one processor to modify the channel filter coefficients comprise one or more code segments that, when executed, cause at least one processor to reduce a magnitude of the channel filter coefficients that are identified based on the threshold criteria.

76. The storage device of claim 72 wherein the one or more code segments that, when executed, cause at least one processor to update the channel filter coefficients comprise one or more code segments that, when executed, cause at least one processor to perform a smoothing algorithm.

77. The storage device of claim 72 wherein the one or more code segments that, when executed, cause at least one processor to update the channel filter coefficients comprise one or more code segments that, when executed, cause at least one processor to replace the channel filter coefficients with replacement channel filter coefficients.

78. The storage device of claim 77 wherein the replacement channel filter coefficients include channel filter coefficients not identified based on the threshold criteria.

79. The method of claim 1 wherein computing the filter coefficients based on the noise sampled during reception of the gap and the data frame preamble sampled from the data frame comprises computing the filter coefficients based on an average of the coefficients derived from the noise sampled during reception of the gap over a period of time.

80. The method of claim 1 wherein computing the filter coefficients based on the noise sampled during reception of the gap and the data frame preamble sampled from the data frame comprises computing the filter coefficients based on an average of the coefficients derived from the data frame preamble sampled from the data frame over a period of time.

81. A method of pre-filtering a received signal to improve synchronization, the method comprising:

receiving a signal including a data frame, and a gap occurring before the data frame, the gap not including predetermined data;

sampling noise received during reception of the gap of the received signal;

generating an adaptive noise-canceling filter based on the sampled noise;

applying the adaptive noise-canceling filter to the received signal; and identifying, in response to application of the adaptive noise-canceling filter, a data frame preamble of the received signal.

82. A system of pre-filtering a received signal to improve synchronization, the system comprising at least one processor, wherein the at least one processor is configured to:

receive a signal including a data frame, and a gap occurring before the data frame, the gap not including predetermined data;

sample noise received during reception of the gap of the received signal;

generate an adaptive noise-canceling filter based on the sampled noise;

apply the adaptive noise-canceling filter to the received signal; and identify, in response to application of the adaptive noise-canceling filter, a data frame preamble of the received signal.

83. The method of claim 1 wherein the gap comprises an inter-frame gap.

84. The method of claim 1 wherein the data frame is a first frame in a series of data frames.

85. The system of claim 14 wherein the gap comprises an inter-frame gap.

86. The system of claim 14 wherein the data frame is a first frame in a series of data frames.

87. The storage device of claim 27 wherein the gap comprises an inter-frame gap.

88. The storage device of claim 27 wherein the data frame is a first frame in a series of data frames.

89. The method of claim 40 wherein the gap comprises an inter-frame gap.

90. The method of claim 53 wherein the data frame is a first frame in a series of data frames.

91. The system of claim 53 wherein the gap comprises an inter-frame gap.

92. The system of claim 53 wherein the data frame is a first frame in a series of data frames.

93. The storage device of claim 66 wherein the gap comprises an inter-frame gap.

94. The storage device of claim 66 wherein the data frame is a first frame in a series of data frames.

95. The method of claim 81 wherein the gap comprises an inter-frame gap.

96. The method of claim 81 wherein the data frame is a first frame in a series of data frames.

97. The system of claim 82 wherein the gap comprises an inter-frame gap.

98. The system of claim 82 wherein the data frame is a first frame in a series of data frames.

* * * * *